United States Patent [19]
Murakami et al.

[11] Patent Number: 5,384,536
[45] Date of Patent: Jan. 24, 1995

[54] NUCLEAR MAGNETIC RESONANACE INSPECTION APPARATUS AND ITS METHOD

[75] Inventors: Yoshiki Murakami, Tokyo; Tetsuhiko Takahashi, Soka; Etsuji Yamamoto, Akishima, all of Japan

[73] Assignee: Hitachi, Ltd., Tokyo, Japan

[21] Appl. No.: 33,543

[22] Filed: Mar. 18, 1993

[30] Foreign Application Priority Data
Mar. 19, 1992 [JP] Japan .................................. 4-063069

[51] Int. Cl.6 ............................................. G01R 33/20
[52] U.S. Cl. ..................................................... 324/309
[58] Field of Search ............... 324/300, 307, 309, 318, 324/322; 128/653.2, 653.5

[56] References Cited
U.S. PATENT DOCUMENTS
5,245,288  9/1993  Leussler ........................... 324/322

Primary Examiner—Michael J. Tokar
Attorney, Agent, or Firm—Antonelli, Terry, Stout & Kraus

[57] ABSTRACT

This application describes a nuclear magnetic resonance inspection apparatus. In this apparatus, a nuclear magnetic resonance signal detected by a detection coil is wirelessly transmitted to a signal processing system. In another embodiment, the nuclear magnetic resonance signal is stored in a memory medium provided to the detection coil. This memory medium can be separated from the detection coil. The signal processing system reads out the nuclear magnetic resonance signal from the memory medium separated, and processes the signal.

31 Claims, 7 Drawing Sheets

FIG. 3A
FIG. 3B
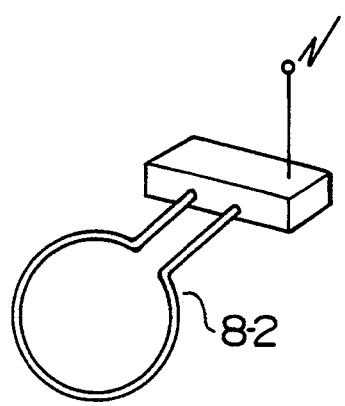
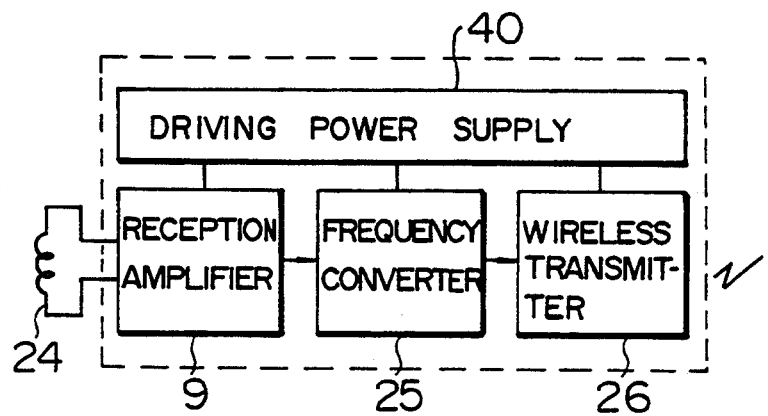
FIG. 4
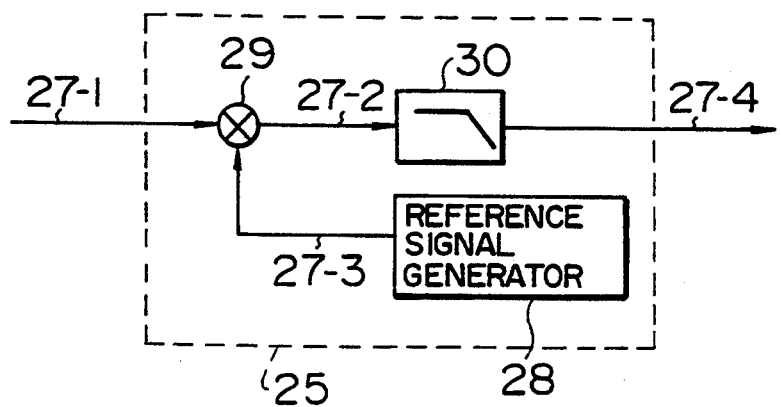

5,384,536

NUCLEAR MAGNETIC RESONANACE INSPECTION APPARATUS AND ITS METHOD

BACKGROUND OF THE INVENTION

This invention relates to a nuclear magnetic resonance inspection apparatus and its method.

More particularly, the present invention relates to a magnetic resonance imaging (hereinafter referred to as "MRI") apparatus for visualizing a density distribution of nuclei, a relaxation time distribution, etc, by measuring nuclear magnetic resonance (hereinafter referred to as "NMR") signals from hydrogen, phosphorus, etc, inside a living body, and specifically to a radio frequency (RF) coil for generating or receiving an RF magnetic field.

To begin with, the function of this RF coil and signal transmission means will be explained with reference to FIG. 1 which is a block diagram showing the construction of an MRI apparatus according to the prior art.

A coil 18 generates a static magnetic field having a predetermined field intensity in a predetermined direction (z-axis direction) inside a space by a current supplied thereto from a power supply 19. Three sets of gradient magnetic field coils 12, 13, 14 are driven by gradient field magnetic field coil drivers 15, 16, 17, respectively, and provide gradients in the z direction and x and y directions orthogonally crossing the z direction to the intensity of the static magnetic field. An RF coil 8 formed on a cylindrical bobbin is disposed in these coils. A movable bed is fitted to a support couch 22, and an object 20 to be examined is inserted into the RF coil 8 while lying on the bed 21. The output of an RF transmitter 6 is amplified by an amplifier 7 for transmission and is then applied to the RF coil, so that the resulting RF magnetic field is irradiated to the object 20. A controller 5 controls the driving timing of each gradient magnetic field coil and the generation timing of the RF magnetic field in accordance with a programmed sequence, and excites the nuclear spins of the object. RF signals resulting from nuclear magnetic resonance of the object are detected by the RF coil 8, and is guided to a signal processor 11 through a reception amplifier 9 and a quadrature phase detector 10. The signal processor executes processing of the reception data which are sampled, and converts them to an image. In this way, the function of the RF coil 8 is to excite the nuclear spins of the object and to detect the NMR signals emitted when the excited nuclear spins return to a steady state.

A signal transmission route at the time of the irradiation of the RF magnetic field extends from the generation of the irradiation signal by the RF transmitter 6 to the amplification of the signal by the transmission amplifier 7 to several kilo-Watts and the transmission of the signal to the RF coil. On the other hand, the signal transmission route at the time of the reception of the NMR signal extends from the detection of the signal emitted from the object 20 by the RF coil to the amplification of the detected signal of several micro-Volts by the reception amplifier 9 and to the transmission to the quadrature phase detector 10. Signal transmission between the members 6 and 7, between 7 and 8, between 8 and 9 and between 9 and 10 is carried out through coaxial cables. The difference between the irradiation operation and the detection operation lies in that whereas a thick cable for large power must be used for the irradiation cables, a thin cable can be used for detection.

Two kinds of transmission/reception systems are available for the RF coil. One is a single coil system which performs both irradiation and detection by one RF coil, and the other is a cross-coil system which separately performs irradiation and detection by two RF coils. The RF coil shown in FIG. 1 is the single coil system. The single coil system is ordinarily used for the whole body coil, and the coil is installed inside a magnet, while the cross-coil system is used for the head coil, the surface coil, and so forth.

However, the prior art example described above is not free from the following problems.

First, if a coaxial cable is connected to a detection RF coil or to an RF coil for both irradiation and detection, the coaxial cable itself plays the role of an antenna and an external noise is more likely to be caught i.e., experienced therein. As a result, a signal-to-noise ratio (S/N) of an image drops. When a part of the coaxial cable is grounded to an electromagnetic shield so as to reduce any external noise, the mode of electromagnetic coupling of the electromagnetic shield and the RF coil becomes different, and the characteristics of the RF coil change unavoidably.

On the other hand, the detection RF coil of the cross-coil system is disposed in close contact with the object, or in such a manner as to encompass the object, in order to receive the NMR signals emitted from the object. Therefore, the detection RF coil must be moved in accordance with an imaging portion. If the coaxial cable is connected to the RF coil in this case, not only movement becomes difficult but also the possibility occurs that the coaxial cable is clamped between movable portions. The RF coil must be exchanged in many cases in accordance with the imaging portions and in such a case, the coaxial cable must be removed and be connected once again. Accordingly, the possibility of erroneous connection or inferior connection develops.

A system for solving these problems is described in JP-A-1-223943 and JP-A-63-194648. However, these prior art references essentially include the connection between the coil and the cable, and cannot completely solve above-mentioned problems.

SUMMARY OF THE INVENTION

It is therefore an object of the present invention to provide a construction of a nuclear magnetic resonance inspection apparatus capable of picking up signals with reduced external noise and without affecting characteristics of an RF coil for signal detection.

It is another object of the present invention to provide a construction of a nuclear magnetic resonance inspection apparatus which permits easy exchange of an RF coil for signal detection and which has a reduced possibility of erroneous connection and inferior connection of signal lines.

To accomplish at least one of the objects described above, the present invention provides the construction wherein a detection signal is amplified inside a probe inclusive of a signal detection coil, and is taken out wirelessly from the probe. More definitely, a detection coil, an amplifier for amplifying the output of the detection coil, a frequency convertor for converting the frequency of the amplified output signal of the detection coil to a signal of a different frequency band and transmission means for transmitting wirelessly the frequency-converted signal to a signal transmission system, are integrally stored in a detection probe disposed in the vicinity of an object to be examined. In addition, the transmission means is adapted to be disposed outside of the probe. The frequency convertor together with the transmission means are also adapted to be disposed outside of the probe.

A reference signal used for the frequency convertor is transmitted wirelessly from outside the probe, typically from the signal processing system.

According to another construction of the present invention, a plurality of detection coils, a plurality of amplifiers for amplifying the outputs of the detection coils, respectively, a frequency convertor for frequency-converting the amplified detection signals to signals of mutually different frequency bands, and transmission means for wirelessly transmitting the frequency-converted signals to the signal processing system, are integrally accommodated in the detection probe disposed in the vicinity of the object. In addition, the transmission means is adapted to be disposed outside of the probe. The frequency convertor together with the transmission means are also adapted to be disposed outside of the probe.

According to still another construction of the present invention, a detection coil, an analog-to-digital (A/D) convertor for sampling the detection signal obtained from the detection coil and converting the signal to a digital signal and transmission means for wirelessly transmitting the digital signal to the signal processing system, are integrally accommodated in the detection probe disposed in the vicinity of the object.

According to still another construction of the present invention, a detection coil, an A/D convertor for sampling the detection signal obtained from the detection coil and converting the signal to a digital signal, and memory means for storing the digital signal, capable of taking out a memory medium, are integrally stored in the detection probe disposed in the vicinity of the object.

According to at least one of the constructions described above, the RF coil can be kept under a complete floating state, and hence, external noise can be suppressed to minimum. When the RF coil is exchanged, each probe having the RF coil mounted thereto may be exchanged as a whole. Since the cable connection operation does not exist in this instance, the exchange operation can be made easily, and neither erroneous connection nor inferior connection occur.

Since the detection signal can be processed both analog-wise and digital-wise before it is transmitted to the quadrature phase detector, a complicated processing can be executed without lowering an S/N ratio.

Since signals such as a reference frequency can be transmitted and received to and from external devices, phase alignment with the quadrature phase detector and synchronization with external devices of the probe can be easily established.

BRIEF DESCRIPTION OF THE DRAWINGS

These and other objects and technical advantages of the present invention will be readily apparent from the following description of the preferred exemplary embodiments of the invention in conjunction with the accompanying drawings, in which:

FIG. 3A is a perspective view showing a probe of the embodiment of the present invention;

FIG. 3B is a block diagram showing the structure of the probe;

FIG. 4 is a block diagram showing the structure of a frequency convertor in the embodiment of the present invention;

DESCRIPTION OF THE PREFERRED EMBODIMENTS

Figure 1:
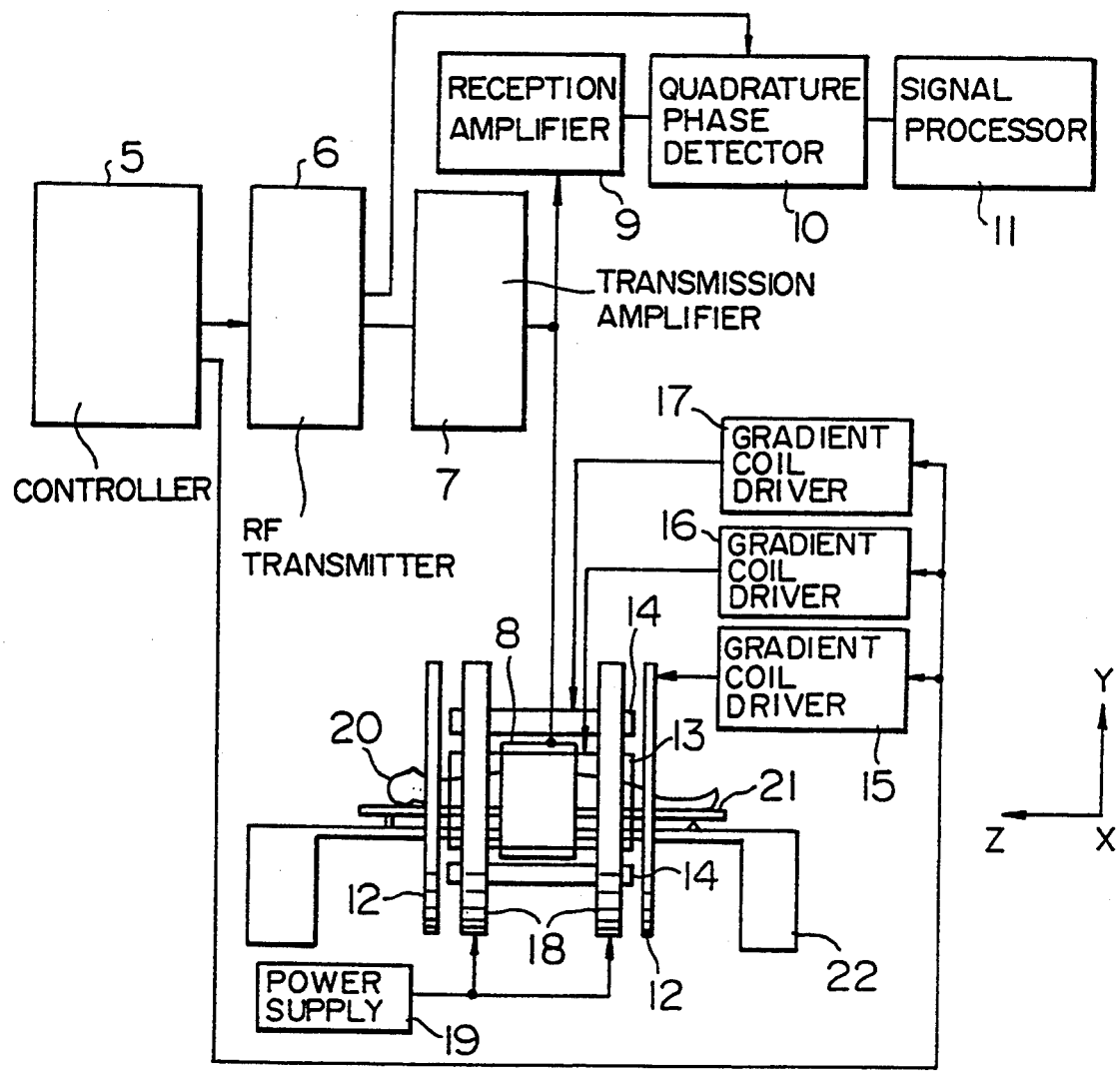
FIG. 1 is a block diagram showing the structure of a nuclear magnetic resonance (NMR) inspection apparatus according to the prior art.
Figure 2:
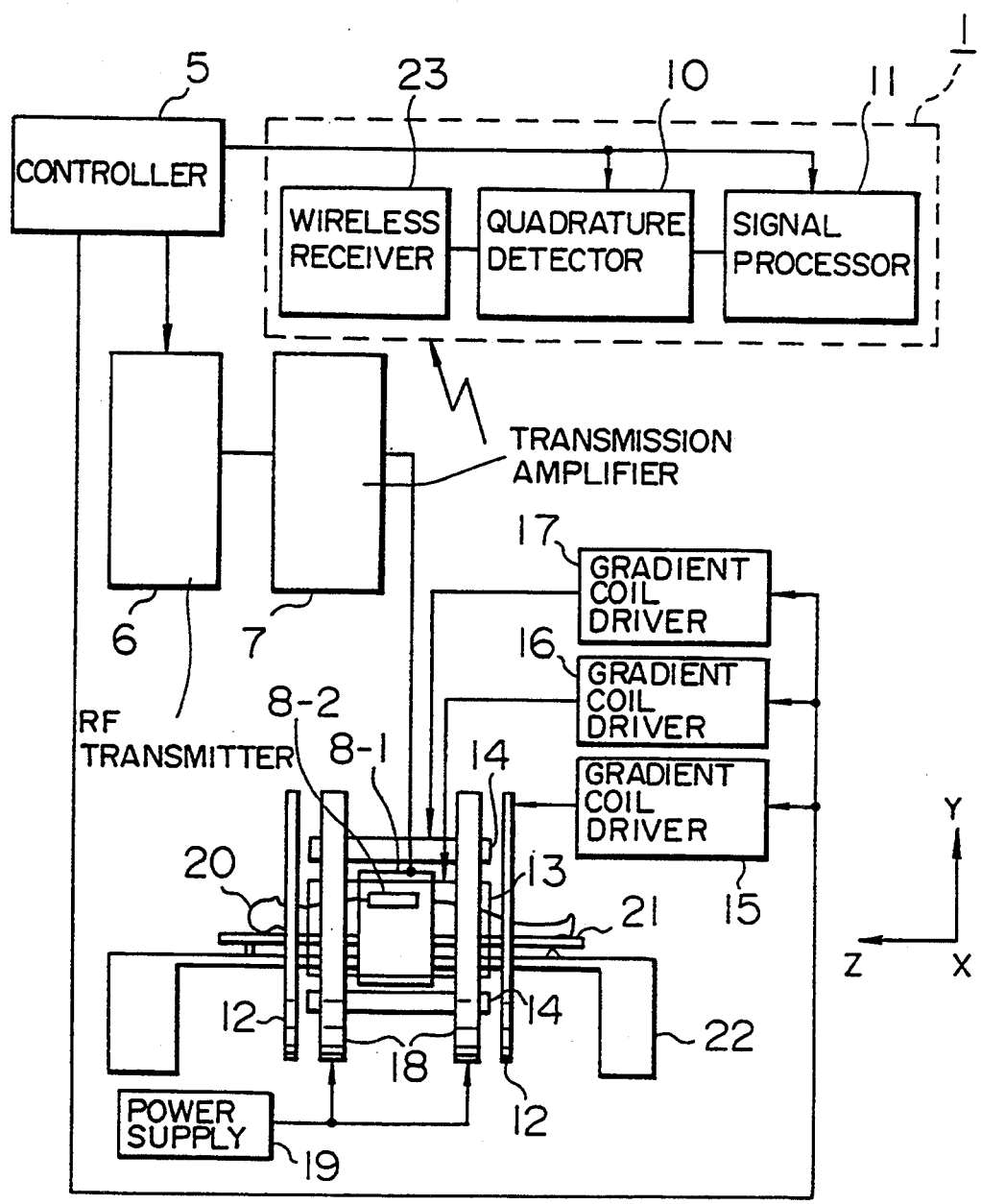
FIG. 2 is a block diagram showing an NMR inspection apparatus according to an embodiment of the present invention.

FIG. 2 is a structural view of an MRI apparatus according to an embodiment of the present invention.

The difference of this embodiment from the prior art resides in that whereas signal transmission means at the time of signal reception according to the prior art uses a coaxial cable, the present invention transmits wirelessly the signals without using the coaxial cable. However, wireless transmission is not performed for the signal transmission of signals of an RF magnetic field for irradiation, for the following reason. For, electric power of several kilo-Watts must be transmitted at the time of signal transmission, and the RF coil for the transmission is installed ordinarily in a magnet and does not need coil exchange.

For the reason described above, the RF coil in the following embodiment is a detection coil for reception only. In other words, the irradiation of the RF magnetic field to an object to be examined for the excitation of nuclear spins, etc, is made by another coil for irradiation. When transmission and reception are effected by one coil such as a coil for the whole body, only the reception route will be discussed. Hereinafter, the detailed description will be given.

Receiving a current from a power supply 19, a coil 18 generates a static magnetic field having a predetermined field intensity in a predetermined direction (a z-axis direction) inside the space. On the other hand, three sets of gradient magnetic field coils 12, 13 and 14 are driven by gradient magnetic field coil drivers 15, 16 and 17, respectively, and apply gradients in the z direction and in x and y directions crossing orthogonally with respect to the former, to the intensity of the static magnetic field. An RF coil 8-1 for irradiation and a probe 8-2 including an RF coil for detection are disposed inside these coils. A movable bed is mounted to a support couch 22, and a patient or object 20 is inserted into the irradiation coil 8-1 while lying on the bed 21. The output of an RF transmitter 6 is amplified by a transmission amplifier 7 and is then applied to the irradiation RF coil 8-1, so that the RF magnetic field is generated. A controller 5 controls the operation timing of each gradient magnetic field coil and the generation timing of the RF magnetic field, and excites nuclear spins of the object. RF signals resulting from nuclear magnetic resonance of the object 20 are detected by the detection RF coil of the probe 8-2 disposed in the proximity of the body surface of the object 20, and the detection signals are wirelessly transmitted. The transmission signals are received by a signal processing system 1, and signal processing for the reconstruction of nuclear spin images is executed. In other words, the signal processing system 1 is provided with a wireless receiver 23, and the signals received by this wireless receiver 23 are guided to a signal processor 11 through a quadrature phase detector 10. The signal processor executes processing to the reception signals sampled, and converts them to images. By the way, a reception amplifier for amplifying the signal detected by the detection RF coil is built in the probe 8-2.

Electromagnetic waves (e.g. FM wave, AM wave, PM wave, etc.) or optical beams (e.g. infrared rays) are used for wireless transmission.

Next, an embodiment of the probe 8-2 will be explained. FIG. 3A is a perspective view of this probe and FIG. 3B is its structural block diagram. Hereinafter, the explanation will be given with reference to the block diagram. The signal emitted from the object is detected by the RF coil 24 and is amplified by the reception amplifier 9. After the frequency is converted to a different frequency from that of the detection signal by the frequency convertor 25, the amplified signal is wirelessly transmitted by the wireless transmitter 26. The signal transmitted in this way is received by the wireless receiver 23 shown in FIG. 2 and after detection by the quadrature phase detector 10, the signal is supplied to the signal processor 11. Power is supplied from a driving power supply 40 to each circuit inside the probe. The reason why the probe incorporates the detection amplifier is to minimize the influences of external noise, and its gain is from about 20 to about 50 dB. The frequency of the detection signal is changed by the frequency convertor before wireless transmission so as to prevent admixture of noise at the time of detection.

The frequency of the signal to be detected is determined by the nuclides and by the intensity of the static magnetic field. The static magnetic field intensity generally used is from 0.12 to 2.0 T and the frequency of the detection signal at this time is from about 5 to about 100 MHz. More definitely, the Larmor frequency of hydrogen at the static magnetic field intensity of 1.5 T is about 63.8 MHz, and the detection signal frequency band received by the RF coil is within some dozens of KHz on both sides with this Larmor frequency being the center. Since the frequency of the detection signal and its band are thus determined in advance, the frequency of the signal may be converted to a different frequency.

FIG. 4 shows a definite structural example of the frequency convertor. The first frequency amplified by the amplifier 9, that is, the signal 27-1 of the detection signal frequency, and a reference signal 27-3 generated by a reference signal generator 28 are multiplied by a multiplier 29, and a mixture signal 27-2 can be obtained. A filter 30 extracts one of the frequency components (a low frequency component) corresponding to the difference of the frequency of the detection signal and the frequency of the reference signal among the mixture signal, and the frequency component (a high frequency component) corresponding to their sum, and this frequency component is led as the second frequency signal 27-4 for transmission to the wireless transmitter 26 shown in FIG. 3A. If the detection signal frequency is 63.8 MHz, for example, the frequency of the reference signal 27-3 is set to 63.6 MHz so as to obtain the mixture signal containing the low frequency component of 200 KHz and the high frequency component of 127.4 MHz, and this 200 KHz low frequency component is utilized for wireless transmission. At this time, a low-pass filter is used as the filter 30 described above. When the 127.4 MHz high frequency component is utilized for wireless transmission, on the other hand, a band-pass filter having a pass center frequency of 127.4 MHz is used as the filter 30. Besides this circuit construction, it is also possible to use the mixture signal containing both the low and high frequency components as it is, and to dispose a filter for extracting the frequency of either one of them on the reception side, that is, inside the wireless receiver 23 shown in FIG. 2 or at a post-stage circuit.

Figure 5:
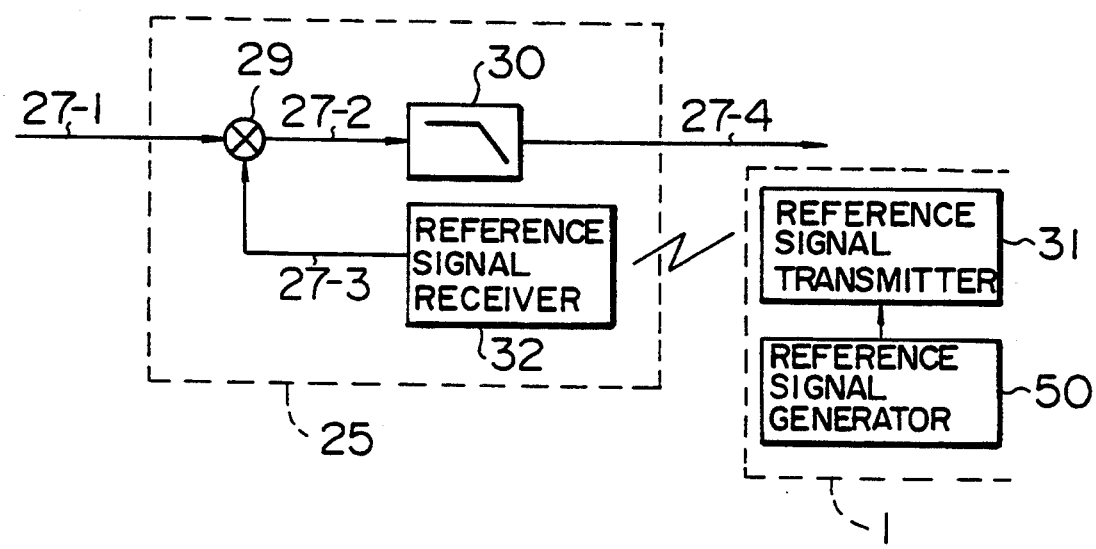
FIG. 5 is a block diagram showing the structure of the frequency convertor in another embodiment.

FIG. 5 shows another example of the frequency convertor. Whereas the frequency convertor shown in FIG. 4 incorporates the reference signal generator, the frequency convertor shown in FIG. 5 has its reference signal generator disposed outside the probe so that the reference signal is wirelessly transmitted. In this embodiment, a reference signal generator 50 and a reference signal transmitter 31 are disposed in the signal processing system (denoted by reference numeral 1 in FIG. 2) for receiving the detection signal transmitted wirelessly and processing the signal, and the reference signal is wirelessly transmitted to the reference signal receiver 32 accessorial to the frequency convertor. According to such a construction, the phases can be aligned always easily between the frequency converted detection signal and the quadrature phase detector.

Figure 6:
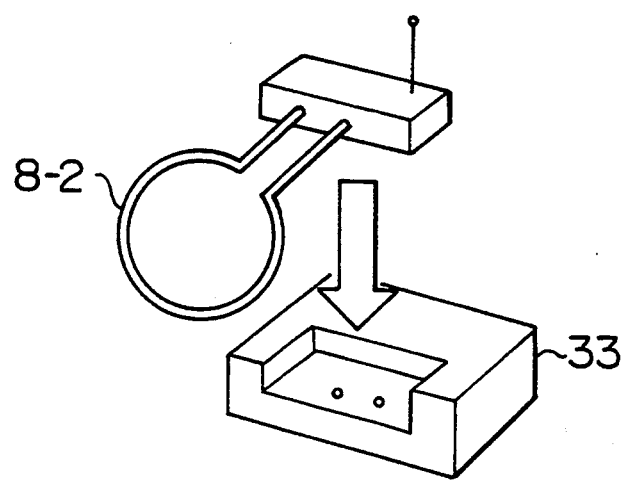
FIG. 6 is a perspective view showing a charging system of the probe.

Next, a definite structural example of the driving power supply 40 shown in FIG. 3B will be explained. FIG. 6 shows the probe 8-2 and a probe table 33. The probe is equipped with a built-in rechargeable battery, and drives the circuit by this battery. The probe is placed on the probe table 33 when it is not used. The probe table has a charging function to charge the battery inside the probe. A non-rechargeable battery can be used, too, and in this case, the battery must be exchanged periodically. Though the probe table is provided with the battery charging function, this function may be provided to other portions, such as inside the bed, for example. In this case, the battery can be charged always except when it drives the circuit. The driving power supply may be provided inside the bed and in this case, the battery inside the probe becomes unnecessary and the battery can be made light in weight.

As to the supply of the charging current, a contact system for plugging the probe into a predetermined position as shown in FIG. 6 may be used. If a non-contact system must be used, a coil for inductive coupling may be used. Another example uses a photo-cell which operates upon irradiation of light transmitting through the object, and is built in the RF coil. In this case, the photo-cell can be operated by merely irradiating light from outside when it is used. This method is particularly effective when the RF coil is buried inside the object.

Figure 7A:
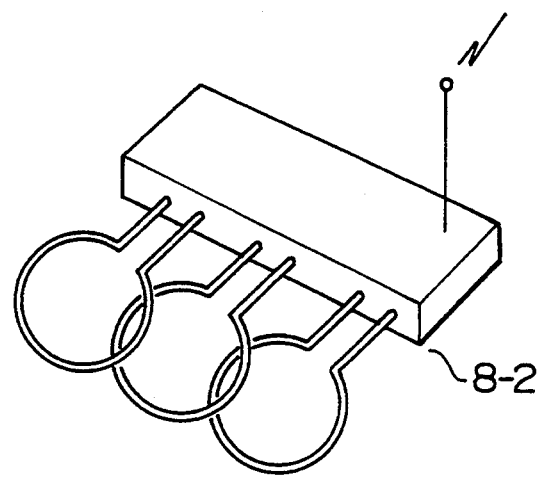
FIGS. 7A and 7B are a perspective view and a block diagram showing the structure of the probe in still another embodiment.
Figure 7B:
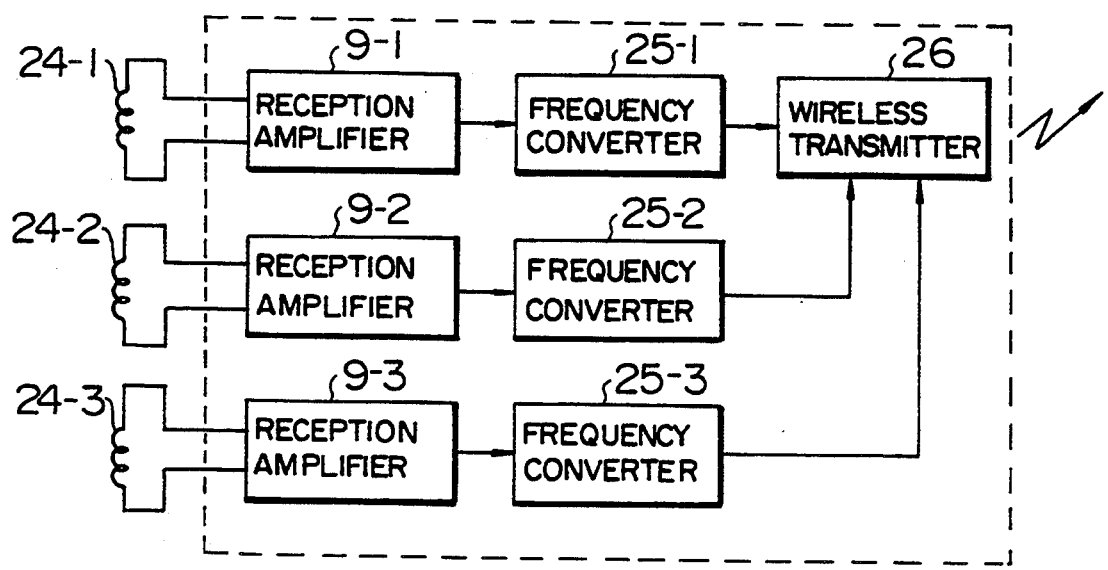

FIG. 7 shows another embodiment wherein a plurality of RF coils are combined with one another. FIG. 7A is a perspective view and FIG. 7B is a block diagram of the structure shown in FIG. 7A. Since the driving power supply is the same as the one shown in FIG. 3, it is omitted from the drawing. Hereinafter, the explanation will be given with reference to the block diagram. The detection coils 24-1, 24-2 and 24-3 operate independently of one another and simultaneously detect the signals. The frequencies used in the frequency convertors 25-1, 25-2 and 25-3 are mutually different, and are 63.6 MHz, 63.4 MHz and 63.2 MHz, for example. Therefore, the intermediate frequencies (the low frequency components of the mixture signal) after the frequency conversion are 200 KHz, 400 KHz and 600 KHz, respectively. As a result, since they do not overlap on the frequency space, the single transmitter 26 can add and transmit simultaneously these signals. Though this embodiment employs the structure comprising the combination of three coils, the number and kind of coils and their disposition are not limited to those shown in the drawing. When a delay circuit is added, the single wireless transmitter can operate further smoothly. If a delay circuit for the delay of 10 ms and another for the delay of 20 ms are interposed between the frequency convertor 25-2 and the wireless transmitter and between the frequency convertor 25-3 and the wireless transmitter, respectively, the detection signals of the three coils can be transmitted sequentially within every 10 ms. A function of transmitting an identification signal may be provided to each coil without using mutually different reference frequencies. If this method is employed, the reference frequency generator needs to generate only a single frequency; hence, the circuit can be simplified. The RF coil for the head, the RF coil for the spine and the RF coil for the whole body are used depending on the imaging portions, but if the identification signal generation function is provided to these coils, respectively, it becomes possible to automatically identify which coil is now connected. Accordingly, the intensity of the RF magnetic field and the gain at the time of reception can be set quickly.

Figure 8:
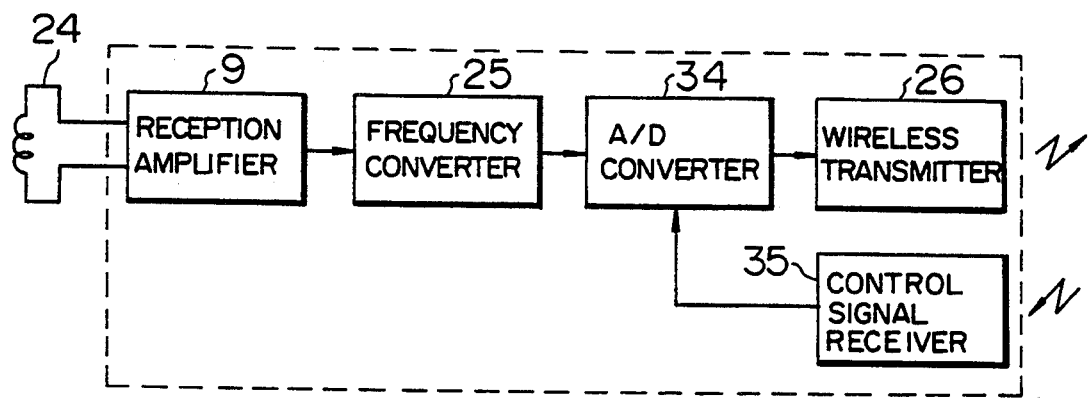
FIG. 8 is a block diagram showing the structure of the probe in still another embodiment.

FIG. 8 shows the probe of still another embodiment. Whereas the foregoing embodiments transmit the signals by the analog signal, this embodiment effects transmission after the detection signal is converted to a digital signal. Hereinafter, the explanation will be given with reference to the block diagram. The difference from the embodiment shown in FIG. 3B lies in that an A/D convertor 34 is additionally inserted between the frequency convertor 25 and the wireless transmitter 26. The A/D convertor 34 hereby used has resolution of about 12 to about 16 bits, for example, and a sampling speed of one to several μs. If the A/D convertor has performance of such an extent, it can be applied to the conversion of the detection signal to a signal of below 500 KHz by the frequency convertor 25 and to the digitization of the signal. An MRI (nuclear magnetic resonance imaging) apparatus determines a measuring sequence, and sampling of the signals is effected in the period determined within this sequence. To this end, this embodiment provides a transmitter for transmitting a controlling signal for controlling the start and stop of sampling to the controller denoted by reference numeral 5 in FIG. 2, and a control signal receiver 35 for receiving this control signal is provided to the probe. Accordingly, the A/D convertor 34 makes signal sampling under the control of the controller 5. Further, a structure for transmitting the set data of the sampling speed from the controller 5 may also be employed. Still alternatively, a sampling clock may be transmitted from the controller 5. If the detected signal is converted from the analog signal to the digital signal and is then transmitted, transmission can be made without the adverse influences of external noise. However, since the signal quantity varies with the object and with the imaging sequence, a function of adjusting a signal level to a suitable level becomes necessary. To accomplish this object, the gain of the reception amplifier may be changed, or an amplifier or a damper may be interposed between the frequency convertor. 25 and the A/D convertor 34. In this instance, gain setting may be made by an initial value set data transmitted from the controller.

Figure 9:
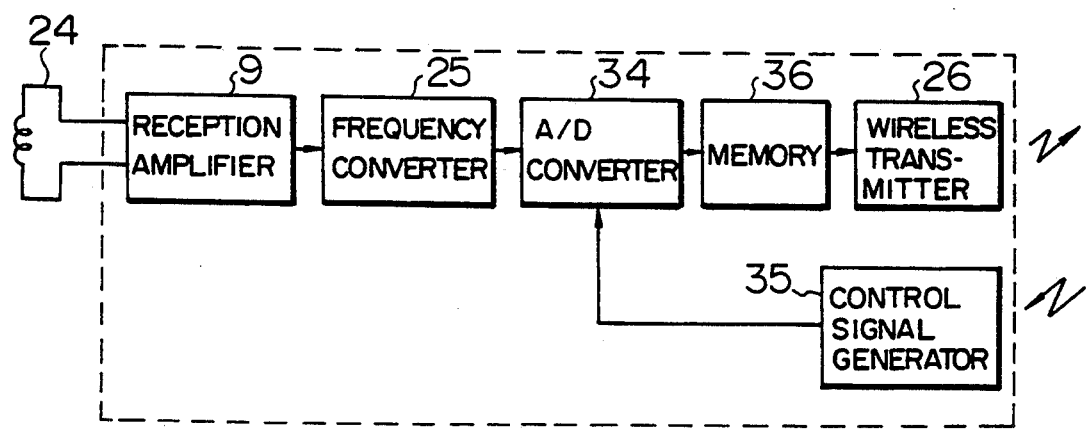
FIG. 9 is a block diagram showing the structure of the probe in still another embodiment.

FIG. 9 shows still another embodiment wherein a memory for storing measurement data is further added to the embodiment shown in FIG. 8. The detection signal data which is converted to the low frequency signal by the frequency convertor 25 and is sampled and converted to the digital signal by the A/D convertor 34 is stored in the memory 36. In one of the examples, one spin echo is measured for each of the measuring sequences for nuclear magnetic resonance imaging, and the measuring sequence is repeated by changing sequentially the phase encoding quantity. The measurement of the spin echos is attained by sampling the signals in a predetermined period, and the data of one period is referred to as "one projection data". Accordingly, storage of the data into the memory 36 is effected for each projection data, and the data is read out from the memory 36 and the transmitter 26 transmits the data during the latency time from the completion of measurement of one period to the start of the next measurement. In other words, the memory 36 is used as a buffer for one projection. This construction is very effective when a plurality of coils simultaneously detect the signals as shown in FIG. 7. In another example, the spin echos having the same phase encoding quantity are measured a plurality of times, and the addition mean data of the spin echos of each time is used for the image reconstruction. In other words, the data of each echo having the same sampling number are added to one another to obtain the addition mean data. In this case, the memory 36 is used for the addition of data. Particularly in the case of spectroscopic imaging, addition of some dozens of times is effective. In this case, if the A/D convertor 34 has 16 bits and the memory 36 is a memory of one word/24-bit type to which the addition function is added, addition can be made maximum 256 times. According to such a construction, only the measurement data after the addition need be transmitted. Therefore, the number of times of transmission can be reduced in comparison with the number of times of measurement of echos.

Figure 10:
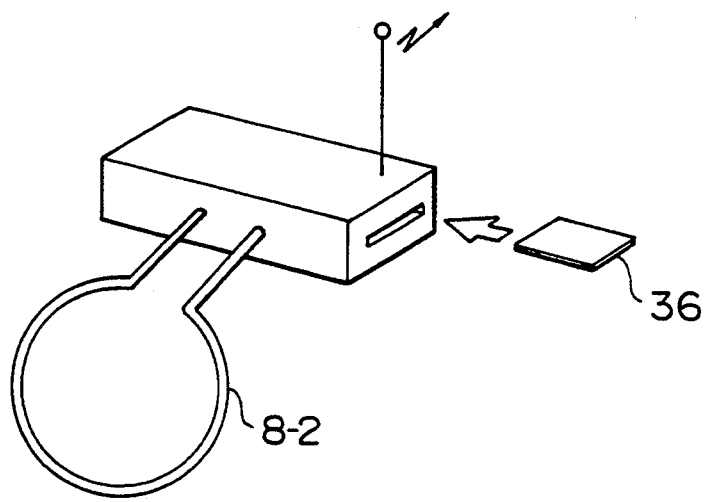
FIG. 10 is a perspective view showing the structure of the probe in still another embodiment.

If a memory capable of storing large quantities of images is prepared, transmission can be made after all the images are taken. This is very effective particularly when large quantities of images are acquired such as in three-dimensional imaging. By the way, the memory may be an ordinary semiconductor memory, but an external medium such as an IC memory card or an optical card can also be used. FIG. 10 shows another embodiment which uses the IC memory card. A card loading port is disposed in the RF coil. The object keeps the waiting state until the IC memory card is loaded into the RF coil and imaging is completed. After imaging is completed, the IC memory card is taken out. If the measurement data can be stored by such a series of operations, it will be very effective for a massive examination, or the like. For example, if an IC memory card is allotted to each individual, the load to the MRI apparatus can be reduced drastically, and display of the image and diagnosis can be made at a desired place, whenever necessary, by connecting an IC memory card reader to a plurality of terminals.

Figure 11:
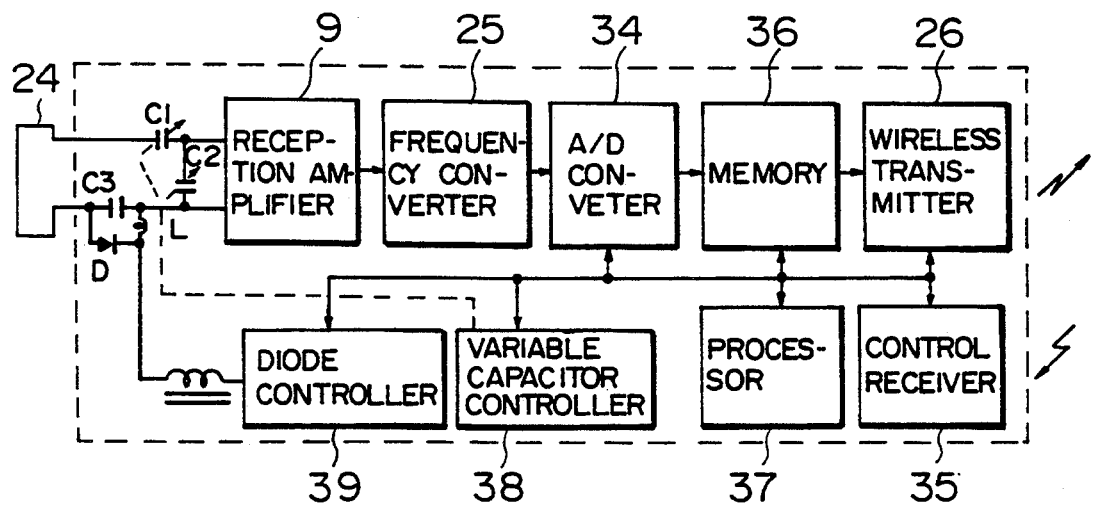
FIG. 11 is a block diagram showing the structure of the probe in still another embodiment.

FIG. 11 shows still another embodiment wherein a processor is added to the circuit shown in FIG. 9. A program and measurement data are transmitted from the controller 5 shown in FIG. 2 to the control signal receiver 35. The processor 37 executes the control of the circuit inside the probe and processing of the measurement data in accordance with the program and the control data received. First of all, the number of matrices of the measurement data, the number of times of integration and the sequence are sent from outside the controller 5. The processor 37 secures in advance data regions on the basis of these data, and puts the file names. During measurement, the processor 37 executes write control of the memory 36 and transmission control of the transmitter 26 in accordance with the sequence transmitted. When the RF magnetic field is irradiated, a bias signal is applied from a diode controller 39 to turn on a diode D of a decoupling circuit comprising a capacitor C3, an inductor L and the diode D. In consequence, a closed circuit comprising C3, L and D undergoes resonance and the impedance at this portion becomes high. Accordingly, the detection RF coil 24 and the irradiation RF coil 8-1 shown in FIG. 2 are decoupled. During signal detection, on the other hand, a reverse bias signal turns off the diode D, so that the decoupling circuit is opened and the detection coil 24 undergoes resonance with the signal. Furthermore, this embodiment includes a variable capacitor controller 38 which is controlled by the processor 37. When an instruction for resonance adjustment of the detection coil is transmitted before the measurement of an intended NMR signal, the processor 37 executes a resonance adjustment program. In other words, the signal having the same frequency as that of the NMR signal is transmitted consecutively to the detection coil 24. On the other hand, the variable capacitor controller 38 changes by very small quantities the capacitances of the resonance adjustment variable capacitors C1, C2 in accordance with the instruction from the processor 37. The processor 37 monitors so that the output of the A/D convertor 35 becomes maximal, controls the capacitances of the variable capacitors C2, C3 and establishes resonance of the detection coil 24.

Though the foregoing embodiments deal with only the surface coil, the present invention can be applied to all the RF coils such as a saddle coil, a slotted tube resonator, a bird cage resonator, a solenoid coil, etc.

As described above, the present invention can keep the Rf coil under the complete floating state, and can therefore suppress the external noise to minimum. Since the exchange of the RF coil need not be made by connecting again the coaxial cable, the coil exchange can be made easily and moreover, within a short time. Processing of the detection signal can be made both analog-wise and digital-wise inside the probe, and complicated processing can be carried out without lowering a signal-to-noise ratio (S/N), so that a stable signal can be obtained. Further, the probe can be easily synchronized with external circuits by employing the construction for transmitting the reference signal, the control signal, and so forth, from outside the probe.

The present invention has been described in detail, it should be understood that various changes, substitutions and alterations can be made hereto without departing from the spirit and scope of the present invention as defined by the appended claims.

We claim:

1. A nuclear magnetic resonance inspection apparatus comprising:
    an irradiation coil for irradiating a radio frequency magnetic field to an object to be inspected;
    a detection coil disposed in the vicinity of said object, for detecting a nuclear magnetic resonance signal from said object;
    analog-to-digital conversion means for sampling the nuclear magnetic resonance signal and converting a sampled signal to a digital signal; and
    transmission means for transmitting wirelessly said digital signal to a signal processor in which the digital data is executed.

2. A nuclear magnetic resonance inspection apparatus comprising:
    an irradiation coil for irradiating a radio frequency magnetic field to an object to be inspected;
    a detection probe including:
        a detection coil for detecting a nuclear magnetic resonance signal from said object;
        means for modulating the nuclear magnetic resonance signal;
        analog-to-digital conversion means for sampling the nuclear magnetic resonance signal modulated and converting a sampled signal to a digital signal; and
        means for transmitting wirelessly said digital signal; and
    a signal processor including:
        means for receiving said digital signal transmitted wirelessly; and
        means for processing the nuclear magnetic resonance signal.

3. A nuclear magnetic resonance inspection apparatus according to claim 2, which further comprises means for amplifying the nuclear magnetic resonance signal, and wherein said modulation means modulates the amplified nuclear magnetic resonance signal amplified.

4. A nuclear magnetic resonance inspection apparatus according to claim 2, wherein said modulation means of said detection probe is a frequency convertor for converting a frequency.

5. A nuclear magnetic resonance inspection apparatus according to claim 4, wherein said frequency convertor executes frequency conversion by the use of a reference signal transmitted wirelessly from outside said probe.

6. A nuclear magnetic resonance inspection apparatus according to claim 5, wherein said reference signal is transmitted wirelessly from a reference signal transmitter provided in said signal processor.

7. A nuclear magnetic resonance inspection apparatus according to claim 4, wherein a plurality of said detection coils are provided, and said frequency convertor converts the nuclear magnetic resonance signals detected by said detection coils to mutually different frequency bands.

8. A nuclear magnetic resonance inspection apparatus according to claim 1, wherein said analog-to-digital conversion means starts sampling on a basis of a control signal transmitted wirelessly from outside said detection probe.

9. A nuclear magnetic resonance inspection apparatus according to claim 8, wherein said signal processor further comprises means for transmitting wirelessly the control signal.

10. A nuclear magnetic resonance inspection apparatus comprising:
an irradiation coil for irradiating a radio frequency magnetic field to an object to be inspected;
a detection probe including:
a detection coil for detecting a nuclear magnetic resonance signal from said object; and
means for writing the nuclear magnetic resonance signal detected from said detection coil into a recording memory medium, said recording memory medium being capable of being taken out from said detection probe; and
a signal processor including:
means for reading out the nuclear magnetic resonance signal from said recording memory medium; and
means for processing a read out nuclear magnetic resonance signal.

11. A nuclear magnetic resonance inspection apparatus according to claim 10, which further comprises analog-to-digital conversion means for converting the nuclear magnetic resonance signal to a digital signal, and wherein said means for writing writes the digital signal to said recording memory medium.

12. A nuclear magnetic resonance inspection apparatus according to claim 11, wherein said recording memory medium is an IC memory card.

13. A nuclear magnetic resonance inspection apparatus comprising:
an irradiation coil for irradiating a radio frequency magnetic field to an object to be inspected;
a detection probe including:
a detection coil for detecting a nuclear magnetic resonance signal from said object;
analog-to-digital conversion means for converting the nuclear magnetic resonance signal to a digital signal;
means for processing the digital signal; and
means for writing the digital signal processed into a recording memory medium, said recording memory medium being capable of being taken out from said detection probe; and
means for reading and displaying the digital signal processed from said memory medium.

14. A nuclear magnetic resonance inspection method comprising the steps of:
irradiating a radio frequency magnetic field to an object to be the inspected;
detecting a nuclear magnetic resonance signal from said object by a detection coil;
writing the nuclear magnetic resonance signal detected into a recording memory medium;
removing said recording memory medium from said detection coil; and
reading the nuclear magnetic resonance signal from said recording memory medium removed, and processing the nuclear magnetic resonance signal.

15. A nuclear magnetic resonance inspection method comprising the steps of:
irradiating a radio frequency magnetic field to an object to be inspected;
detecting a nuclear magnetic resonance signal from said object by a detection coil;
modulating the nuclear magnetic resonance signal;
converting a modulated signal from said modulating step to a digital signal:
transmitting wirelessly said digital signal to a signal processing system; and
processing said digital signal transmitted wirelessly in said signal processing system.

16. A detection probe comprising:
a detection coil for detecting a nuclear magnetic resonance signal from said object;
means for modulating the nuclear magnetic resonance signal;
analog-to-digital conversion means for sampling the nuclear magnetic resonance signal modulated and converting a sampled signal to a digital signal; and
means for transmitting wirelessly said digital signal.

17. A detection probe according to claim 16, which further comprises means for amplifying the nuclear magnetic resonance signal, and wherein said means for modulating modulates the amplified nuclear magnetic resonance signal.

18. A detection probe according to claim 16, wherein said for modulating means of said detection probe is a frequency convertor for converting a frequency.

19. A detection probe according to claim 18, wherein said means for converting executes frequency conversion by the use of a reference signal transmitted wirelessly from outside said probe.

20. A detection probe according to claim 19, wherein said reference signal is transmitted wirelessly from a reference signal transmitter provided in a signal processor for processing the nuclear magnetic resonance signal detected by said detection probe.

21. A detection probe according to claim 16, wherein a plurality of said detection coils are provided, and said frequency convertor converts the nuclear magnetic resonance signals detected by said detection coils to mutually different frequency bands.

22. A probe according to claim 16, wherein said analog-to-digital conversion means starts sampling on a basis of a control signal transmitted wirelessly from outside said detection probe.

23. A signal processor comprising:
a signal processor including:
means for receiving a digital signal transmitted wirelessly and corresponding to a nuclear magnetic resonance signal; and
means for processing said nuclear magnetic resonance signal.

24. A detection probe comprising:
a detection coil for detecting a nuclear magnetic resonance signal from said object; and
means for writing the nuclear magnetic resonance signal detected from said detection coil into a recording memory medium, said recording memory medium being capable of being taken out from said detection probe.

25. A detection probe according to claim 24, which further comprises analog-to-digital conversion means for converting the nuclear magnetic resonance signal to a digital signal, and wherein said write means writes the digital signal to said memory medium.

26. A detection probe according to claim 24, wherein said memory medium is an IC card.

27. A nuclear magnetic resonance inspection apparatus according to claim 2, wherein said modulation means of said detection probe is a frequency convertor for converting the nuclear magnetic resonance signal to a lower frequency signal than a frequency of the nuclear magnetic resonance signal.

28. A nuclear magnetic resonance inspection apparatus according to claim 11, wherein said detection probe further includes transmission means for transmitting wirelessly the digital signal memorized in said recording memory medium.

29. A nuclear magnetic resonance inspection apparatus according to claim 13, wherein said detection probe further includes transmission means for transmitting wirelessly the digital signal memorized in said recording memory medium.

30. A nuclear magnetic resonance inspection apparatus according to claim 29, wherein said transmission means is controlled by said means for processing.

31. A nuclear magnetic resonance inspection method according to claim 14, further including a step of transmitting wirelessly the nuclear magnetic resonance signal memorized in said recording memory medium, and a step of processing the nuclear magnetic resonance signal transmitted.

* * * * *